United States Patent
Ichimaru

(10) Patent No.: US 6,169,457 B1
(45) Date of Patent: Jan. 2, 2001

(54) FREQUENCY SYNTHESIZER WITH A SWITCHED CAPACITOR COMPENSATION CIRCUIT

(75) Inventor: Kouzou Ichimaru, Ohita (JP)

(73) Assignee: Texas Instruments Incorporated, Dallas, TX (US)

(*) Notice: Under 35 U.S.C. 154(b), the term of this patent shall be extended for 0 days.

(21) Appl. No.: 09/170,458

(22) Filed: Oct. 13, 1998

(30) Foreign Application Priority Data

Oct. 16, 1997 (JP) .................................................... 9-299482

(51) Int. Cl.[7] ...................................................... H03L 7/08
(52) U.S. Cl. .............................. 331/17; 327/536; 327/156; 327/157
(58) Field of Search ............................... 331/17; 327/156, 327/157, 536

(56) References Cited

U.S. PATENT DOCUMENTS

| | | | |
|---|---|---|---|
| 4,204,174 | 5/1980 | King | 331/10 |
| 5,021,749 * | 6/1991 | Kasai et al. | 331/17 |
| 5,166,642 | 11/1992 | Hietala | 331/1 A |
| 5,343,169 * | 8/1994 | Debaty | 331/17 |
| 5,495,206 | 2/1996 | Hietala | 331/1 A |
| 5,793,257 * | 8/1998 | Inanami et al. | 331/17 |

FOREIGN PATENT DOCUMENTS 0 429 217 A2  5/1991 (GB) ............................ H03L 7/197

* cited by examiner

*Primary Examiner*—Arnold Kinkead
(74) *Attorney, Agent, or Firm*—Bret J. Petersen; Frederick J. Telecky, Jr.

(57) ABSTRACT

To provide a type of frequency synthesizer having excellent characteristics and free of spurious component in the output signal. In frequency synthesizer (2), frequency divider (32) makes the frequency division value change periodically; external output signal OUT output from oscillator (31) is divided by the average frequency division value to generate a comparative signal; phase comparator (34) compares the phase of the comparative signal with the phase of the reference clock signal; oscillator (31) is controlled such that the frequency of external output signal OUT becomes a value equal to the frequency of the reference clock signal times the average frequency division value; the voltage applied to compensation circuit (10) is changed abruptly, and a compensating current is generated, and the ripple current generated is cancelled in synchronization to the reference clock signal.

6 Claims, 3 Drawing Sheets

FREQUENCY SYNTHESIZER WITH A SWITCHED CAPACITOR COMPENSATION CIRCUIT

FIELD OF THE INVENTION

The invention pertains to the technical field of frequency synthesizers. In particular, the invention pertains to a technology for ripple component compensation when the counter frequency division value is changed periodically.

BACKGROUND OF THE INVENTION

The cellular phone is of the frequency multi-channel access type. In order to shift the application frequency to an empty channel when the phone shifts from the standby to conversation mode, it is necessary to have a frequency synthesizer which can lock on an available channel at high speed.

In FIG. 6, 101 represents an example of the frequency synthesizer of the prior art using the PLL circuit technology of the fractional frequency division method. It is arranged inside the semiconductor device that forms a transceiver of the cellular phone.

This frequency synthesizer 101 contains the following parts: oscillator 131, frequency divider 132, reference clock signal generator 133, phase comparator 134, charge pump circuit 135, and low-pass filter 136. Said oscillator 131 has a configuration that outputs external signal OUT to the other circuit in the semiconductor device having frequency divider 132 and frequency synthesizer 101.

Frequency divider 132 divides input external output signal OUT and generates a comparative signal. A comparative signal from frequency divider 132 and a reference clock signal output from reference clock generator 133 are input to phase comparator 134; the phase of the signals is read. The result is used as a control signal which is output through charge pump circuit 135 and low-pass filter 136 to oscillator 131.

For oscillator 131, based on the input control signal, the frequency of external output signal OUT is changed such that the comparative signal and the reference clock signal are in phase. As a result, the frequency of external output signal OUT becomes a value equal to the frequency of the reference clock signal times the division value of frequency divider 132.

However, with the cellular phone, where high frequencies of 800 MHz, 1 GHz, etc. are used as the reference, the inter-channel distance is 25 kHz, 12.5 kHz, etc. Consequently, it is necessary to form external output signal OUT with narrow channel intervals, such as 800.025 MHz, 800.050 MHz, etc.

On the other hand, in order to increase the response speed, the reference clock signal must be a high frequency signal. Consequently, the frequency division value of frequency divider 132 is changed periodically, an average frequency division value having a fraction value is generated, and the high-frequency reference clock signal is multiplied by the average frequency division value, so that external output signal OUT having the desired frequency is obtained.

For example, when a reference clock signal with a frequency of 200 kHz is used, suppose that the frequency division value is 4,000 for a duration of seven periods (35 μsec) of the reference clock signal, and the frequency division value is 4,001 for the duration of one period (5 μsec), then the average frequency division value of the 8 periods becomes 4,000.125 (=4,000+⅛), and external output signal OUT has a frequency of 200 kHz×(4000+⅛)=800.025 MHz that is, 800.025 MHz.

During the eight periods, suppose the frequency division value of two periods is 4,001, the average frequency division value becomes 4,000.25. Consequently, the frequency of external output signal OUT becomes 800.050 MHz. In this way, since the frequency division value is made to change periodically, it is possible to obtain external output signal OUT at the desired frequency from the reference clock signal at a relatively high frequency.

However, when the frequency division value is made to change periodically as described above, even after external output signal OUT is locked to the desired frequency, the phase of the comparative signal and the phase of the reference clock signal are still not in agreement with each other. Consequently, from phase comparator 134, a control signal indicating the phase difference between the comparative signal and the reference clock signal becomes a ripple current and is output through a charge pump circuit.

In FIG. 7, (a) represents the waveform of the comparative signal output from frequency divider 132 in the case of frequency division of external output signal OUT to frequency division value N and frequency division value N+1. (b) represents the reference clock signal. Since it is not in agreement with the phase of comparative signal (a), ripple current c is superimposed on the control signal output from charge pump circuit 135.

Such ripple current c not only degrades the receiving characteristics of the cellular phone or other communication device, but also acts as an interference component in transmission. Consequently, it becomes a serious problem.

Certain measures have been adopted to solve such problems in the prior art. For example, compensation circuit 140 made up of a charge pump circuit is arranged in frequency synthesizer 102 shown in FIG. 8. As shown by (d) in FIG. 7, compensation current having a polarity opposite to ripple current c is generated, ripple current c is cancelled by compensation current d, and the phase of external output signal OUT is locked. In this state, the signal that changes the frequency of external output signal OUT is not input to oscillator 131.

In order to cancel ripple current c by compensation current d, it is necessary to cancel the charge fed by ripple current c correctly by means of the charge supplied by compensation current d.

However, since the response of compensation circuit 140, made up of a charge pump, is poor, compensation current d is output with a certain delay with respect to ripple current c. Also, the output time of compensation current d becomes longer than the output time of ripple current c. This is a disadvantage. For example, while the duration of output of ripple current c is as short as several hundred psec, the duration of compensation time d is several hundred nsec. Consequently, when ripple current c has a current value of a few mA, in order to provide the same charge amount but with opposite polarity, the current value of compensation current d becomes as small as a few μA, and it is impossible to perform the cancellation correctly. Consequently, it is difficult to eliminate the influence of ripple current c on conventional compensation circuit 140.

FIG. 9 is a graph illustrating the relationship between the frequency component and optical intensity of output signal OUT of said frequency synthesizer 102. The abscissa represents intensity, and the ordinate frequency. In this example, the reference clock signal has a frequency of 240 kHz, and the average frequency division value is 4,000+⅛. Around the center at the frequency (960.030 MHz) obtained by muultiplying the frequency of the reference clock signal with the average frequency division value, a spurious component is observed at a prescribed frequency interval. Such spurious components cause deterioration in the transceiving characteristics, and it is preferred that such spurious components be eliminated.

The purpose of the invention is to solve the aforementioned problems of the conventional technology by providing a type of frequency synthesizer which has no spurious components in the output signal, and which has excellent characteristics.

SUMMARY OF THE INVENTION

In order to solve the aforementioned problems, the invention described in claim 1 provides a type of frequency synthesizer that contains an oscillator which outputs an output signal to the outside, a frequency divider which divides the external output signal output from the aforementioned oscillator so that its frequency division value is in periodic variation to generate a comparative signal, a phase comparator which compares the phase of the aforementioned comparative signal with the phase of a reference clock signal, and controls the aforementioned oscillator such that the aforementioned external output signal has a frequency that equals the frequency of the aforementioned reference clock signal times the average frequency division value of the aforementioned frequency division values, a capacitor with one end connected to the transmission path of the signal that controls the aforementioned oscillator, and a voltage controller connected to the other end of the aforementioned capacitor.

In another embodiment in the present invention, there are plural capacitors connected to one end of the aforementioned transmission path, and the aforementioned voltage controller can apply 2 or more voltages to the other end of each of the aforementioned capacitors.

In another embodiment in the present invention, the aforementioned voltage controller of the frequency synthesizer described in claim 2 has two or more power sources and plural switch circuits that output different voltages; the aforementioned capacitors are connected to two or more of the aforementioned power sources through the aforementioned switching circuits, respectively; and, by operating the aforementioned switching circuits, it is possible to switch the power source connected to the desired capacitor.

In another embodiment in the present invention, for the frequency synthesizer described in claim 1, the aforementioned voltage controller is made up of a digital/analog converter so conFIG.d that the desired voltage can be applied to the aforementioned capacitor.

The frequency synthesizer of the invention having the aforementioned configuration has an oscillator, a frequency divider, and a phase comparator. The frequency divider makes the frequency division value change periodically, and divides the external output signal output from the oscillator to generate a comparative signal. The phase comparator compares the phase of the comparative signal with the phase of the reference clock signal, and it controls the oscillator such that the external output signal has a frequency equal to the frequency of the reference clock signal times the average frequency division value. By changing the average frequency division value using the aforementioned configuration, it is possible to make the external output signal have the desired frequency.

Consequently, a capacitor and a voltage controller are used in this frequency synthesizer. One end of the capacitor is connected to the transmission path of the signal that controls the oscillator, and the other end is connected to the voltage controller.

Consequently, when the voltage applied to the capacitor is changed from the voltage controller, it is possible to superimpose the pulse-like compensation current to the aforementioned transmission path at the moment of change. Since the compensation current is generated by charging/discharging of the capacitor, it is possible to perform high-speed operation similar to the compensating circuit made up of a charge pump circuit.

The charge amount of the ripple current is an integral multiple of the minimum charge amount. Consequently, plural capacitors are set, and, by means of a voltage controller, at least two voltages can be applied to the other end of each capacitor by means of the voltage controller. By switching the voltage of each capacitor, it is possible to generate the compensation current with the minimum charge amount. In this way, it is possible to cancel the ripple current correctly with a charge amount an integral multiple of the minimum charge amount.

For switching the voltage of capacitor, two or more power sources that can output different voltages and plural switch circuits are arranged in the voltage control circuit. The capacitors are connected through the switching circuits to two more more respective power sources. By simply operating the switch circuits, it is possible to switch the voltages applied to the various capacitors. Consequently, it is possible to generate the compensation current in a correct charge amount in a simple circuit.

On the other hand, the voltage controller is made up of a digital/analog converter, and it can apply the desired voltage to the capacitor. By adjusting the amount of change to the output voltage of the digital/analog converter, it is possible to generate the compensating current having the desired charge amount. In this case, one capacitor may be sufficient for the operation.

REFERENCE NUMERALS AND SYMBOLS AS SHOWN IN THE DRAWINGS

| | |
|---|---|
| 2, 3 | Frequency synthesizer |
| 11, 21 | Capacitor |
| 12 | Voltage controller |
| 13 | Switching circuit |
| 14, 15 | Power source |
| 24 | Digital/analog converter (D/A converter) |
| 31 | Oscillator |
| 32 | Frequency divider |
| 34 | Phase comparator |

DESCRIPTION OF THE EMBODIMENTS

Figure 1:
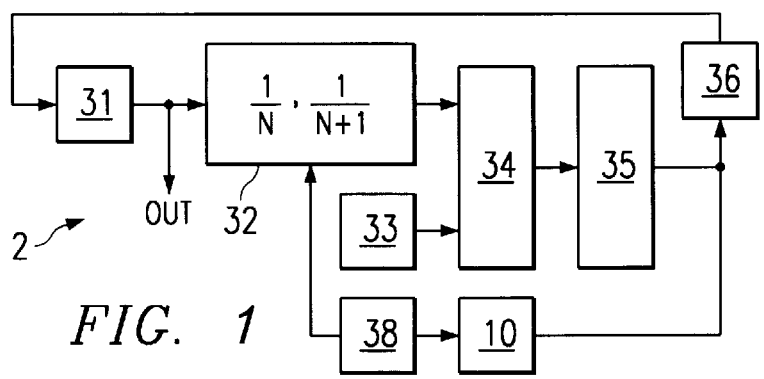
FIG. 1 is a block diagram illustrating an example of the frequency synthesizer of the invention.

As shown in FIG. 1, 2 represents an example of the frequency synthesizer of the invention. It is installed inside a semiconductor device.

Said frequency synthesizer 2 has oscillator 31, frequency divider 32, reference clock signal 33, phase comparator 34, charge pump circuit 35, low-pass filter 36, controller 38, and compensation circuit 10. The external output signal OUT output from oscillator 31 is sent to the other circuits in the semiconductor circuit, and it is also output to frequency divider 32.

Said frequency divider 32 has a configuration which enables control by controller 38 and has the frequency division value change periodically. External output signal OUT that is input is divided by the frequency division value to generate a comparative signal at a lower frequency.

Reference clock signal generator 33 generates the reference clock signal at the prescribed frequency, and the reference clock signal and the comparative signal are input to phase comparator 34.

Phase comparator 34 compares the phases of the two signals, and outputs the comparison result as a control signal to charge pump circuit 35.

Charge pump circuit 35 converts the control signal input from phase comparator 34 to a current (charge), and outputs it through low-pass filter 36 to oscillator 31. Oscillator 31 follows the input control signal to change the frequency of external output signal OUT. As a result, the frequency of external output signal OUT is locked to the value equal to frequency of the reference clock signal times the average frequency division value.

For example, if the duration of seven periods of the reference clock signal is N and the duration of one period is N+1, the frequency division value of frequency divider 32 has an average frequency division value of N+⅛. Suppose the reference clock signal is 200 kHz and said N is 5,000, external output signal OUT becomes a frequency of 1,000,025 kHz.

Figure 2:
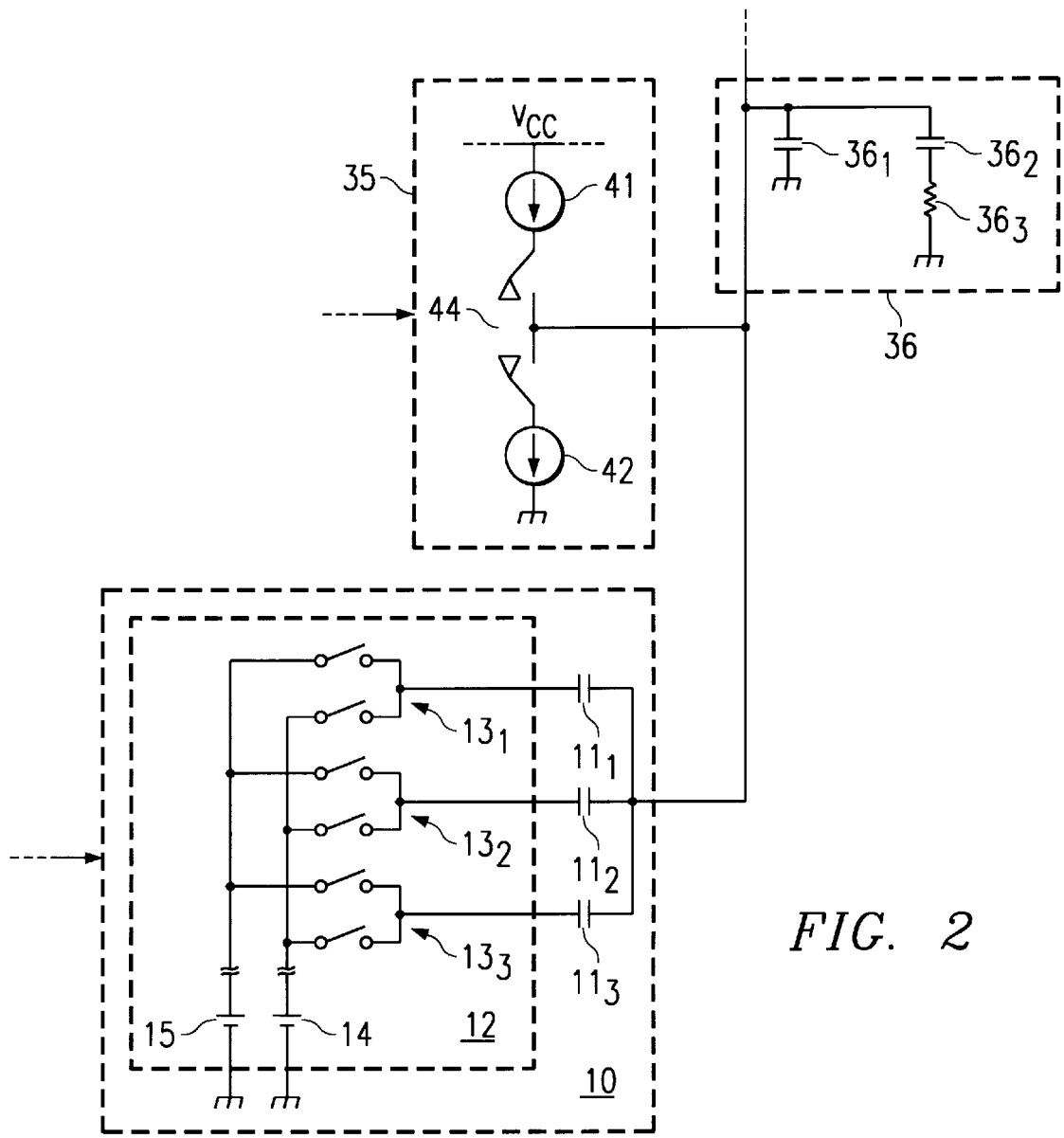
FIG. 2 is a diagram illustrating the compensation circuit of the frequency synthesizer.

After the frequency of external output signal OUT is locked, the ripple current is contained in the control signal output from phase comparator 34. As shown in FIG. 2, the output stage of said charge pump circuit 35 is made up of switch 44 and two constant-current circuits 41 and 42. Switch 44 is controlled by the control signal input from phase comparator 34. The charge calculated by multiplying the phase difference of the output current of constant-current circuits 41 and 42 (phase difference x constant current) is supplied or removed, so that the control signal is converted into charge. Consequently, the control signal input to oscillator 31 contains the charge ripple (current). Also, as shown in FIG. 2, low-pass filter 36 is made up of two capacitors and one resistor, and the capacitance of capacitor 361 is less than the capacitance of capacitor 362.

Suppose the output current of constant-current circuits 41 and 42 is 1 mA, the frequency of the reference clock signal is 200 kHz, and the average frequency division value is N+⅛, then the ripple charge generated becomes a charge amount in the range from a minimum value of ñ0.5 times Qr (0.5 Qr) to a maximum value of ñ3.5 times Qr (3.5 Qr) with interval of (1.0 Qr).

$$Q_r = (\tfrac{1}{8}) \times (\tfrac{1}{1000025} \text{ kHz}) \times 1 \text{ mA} = 1.25 \times 10^{-14} \quad \text{(Coulomb)}$$

The generation period is identical to the frequency of the reference clock signal, and it is repeatedly generated in the following order:

+3.5 Qr→+2.5 Qr→+1.5 Qr→+0.5 Qr→-0.5 Qr→-1.5 Qr→-2.5 Qr→-3.5 Qr

In frequency synthesizer 2 of this invention, compensation circuit 10 is connected to the output terminal side of charge pump circuit 35. By means of controller 38, the capacitor in compensating circuit 10 charges/discharges, so that a compensation current having charge polarity opposite to that of the ripple current and having charge amount equal to that of the ripple current is generated.

Said compensation circuit 10 will be explained below. Said compensation circuit 10 has plural capacitors 11 (here, three capacitors 111–113 are shown) and voltage controller 12.

In voltage controller 12, switch circuits 13 in equal number to the capacitors (here, three switch circuits 131–133 are shown) and two power sources 14 and 15 that output different voltages are arranged. One end of each capacitor 11 is connected to the output terminal of charge pump circuit 35, and the other end is connected through switch circuit 13 to power source 14 or 15.

By means of switch circuit 13, each capacitor 11 is connected to one of two power sources 14 and 15 beforehand. Among switch circuits 13, the connection state can be switched for the desired switch circuits, so that connection is switched to the other power source of said two power sources 14 and 15.

In this case, for capacitor 11 for which connection to power sources 14 and 15 is switched, as the terminal voltage is changed abruptly, a pulse-like compensation current (charge) is generated by means of charging/discharging, and it is superimposed on the control signal output from charge pump circuit 35.

If the capacitance of each said capacitor 11 is $C_0$, power source 14 has a high voltage $E_1$ while the other power source 15 has a low voltage $E_2$ ($E_1 > E_2$), and the voltage difference is $V_d$ ($=E_1-E_2>0$), if connection of capacitor 11 is switched from power source 15 (low voltage $E_2$) to power source 14 (high voltage $E_1$), a charge of $+C_0 \times V_d$ can be generated for each capacitor.

On the other hand, when switching is performed from power source 14 (high voltage $E_1$) to power source 15 (low voltage E2), the compensation charge for each capacitor 11 is $-C_0 \times V_d$.

As explained above, when the ripple charge is generated as an integral multiple of the charge unit of 0.5 Qr $$(Q_r = 1.25 \times 10^{14} \text{(Coulomb)})$$

voltages $E_1$ and $E_2$ of power sources 14 and 15 are adjusted, and with respect to capacitance $C_0$ of each capacitor 11, voltage difference $V_d$ becomes $$C_0 \times V_d = Q_r/2$$

If capacitance $C_0$ is 1 pF, then the voltage difference $V_d$ is 125 mV.

Since the ripple charge is generated in the order of $$+3.5\ Q_r \rightarrow +2.5\ Q_r \rightarrow +1.5\ Q_r \rightarrow +0.5\ Q_r \rightarrow -0.5\ Q_r \rightarrow -1.5\ Q_r \rightarrow -2.5\ Q_r \rightarrow -3.5\ Q_r$$

as explained above, 16 capacitors 11 are used. First all capacitors 11 are connected to power source 15. For generation of ripple charge of +3.5 $Q_r$, +2.5 $Q_r$, +1.5 $Q_r$, +0.5 $Q_r$ connection of 7, 5, 3, and 1 capacitor 11 is switched to power source 14 synchrononsly, so that a negative compensating charge is generated to cancel the positive ripple charge.

Then, in order to generate ripple charges of $$-0.5\ Q_r,\ -1.5\ Q_r,\ -2.5\ Q_r,\ -3.5\ Q_r$$

connection of 1, 3, 5, and 7 capacitor 11 is switched from power source 14 to power source 15 synchronously, so that a positive compensation charge is generated to cancel the negative ripple charge.

In this way, by using frequency synthesizer 2 of the invention, control of the charge amount of the compensating current can be performeed easily and correctly. Generation of the compensating current is due to the change in the capacitor voltage. Consequently, the following property is good, and the waveform of the compensating current becomes similar to that of the ripple current. Consequently, it is possible to obtain output signal OUT free of spurious components.

In order to generate the compensating current in synchronization to the ripple current, switching is performed by means of switch 13.

Suppose the number of capacitors 11 is positive when switching is performed from power source 15 (low voltage $E_2$) to power source 14 (high voltage $E_1$), and the number of capacitors 11 is negative when switching is performed from power source 14 (high voltage $E_1$) to power source 15 (low voltage $E_2$), with respect to said ripple charge of +3.5 Qr to −3.5 Qr, the switching number of capacitors 11 can be represented as $$-7, -5, -3, -1, +1, +3, +5, +7$$

In the above, explanation has been made for the case when the average frequency division value is 5,000+⅛. When the other conditions remain the same, the numbers of switching of the capacitors for the average frequency division values of 5,000+⅖ to 5,000+⅞ are listed in the following table.

[Table I as shown on p. 17]

As can be seen from the aforementioned table, for the frequency division of (X/8), it is possible to generate a compensating current of the charge of opposite polarity and the same charge amount as the ripple current. For the (x/M) frequency division, in the same way, by means of compensation circuit 10, it is possible to generate a compensation current having the same amount and opposite polarity that of the ripple current.

Figure 3:
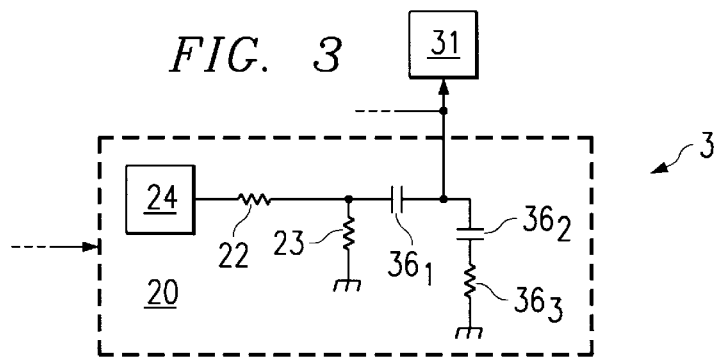
FIG. 3 is a block diagram illustrating a portion of another example of the frequency synthesizer of the invention.

Other embodiments of the invention will be explained below. In FIG. 3, 3 represents the frequency synthesizer in an example of the invention. Compensation circuit 10 of said frequency synthesizer 2 is changed to a different compensation circuit 20. The other structural features of said frequency synthesizer 3 are identical to those of said frequency synthesizer 2. Consequently, explanation of the overall operation is omitted.

Compensation circuit 20 in. FIG. 3 functions together with low-pass filter 36. For low-pass filter 36, D/A converter 24 and two resistors 22 and 23 are added. One end of capacitor 361 of low-pass filter 36 is connected to the output terminal of charge pump circuit 35, and the other end is connected through resistor 22 to the output terminal of D/A comparator 24.

D/A converter 24 is controlled by controller 38. The digital signal input from controller 38 is converted into an analog voltage signal, and the voltage is applied to capacitor 361 via resistor 22.

The other end of resistor 23, which has one end grounded, is connected to the node between capacitor 361 and resistor 22.

For compensation circuit 20 with the aforementioned configuration, when the voltage of D/A converter 24 is changed stepwise, a pulse-like compensation current is output from capacitor 361 at the moment that the voltage is changed, and it is overlapped on the control signal output from charge pump 35.

Suppose the capacitance of capacitor 361 is $C_1$ and the resistances of resistors 22 and 23 are R22 and R23, respectively, when the output voltage of D/A converter 24 is changed by $V_e$, a compensation current with charge of $$C_1 \cdot (R_{23}/(R_{22}+R_{23})) \cdot V_e$$

is output from capacitor 361.

When the minimum charge amount of the ripple current is 0.5 Qr, in order to generate a compensation current for compensating the ripple current of minimum charge amount 0.5 Qr, C1, R22, R23, and $V_e$ are set such that $$C_1 \cdot (R_{23}/(R_{22}+R_{23})) \cdot V_e = Qr/2$$

When $C_1$ is 1,000 pF, R22 is 99.9 kê, R23 is 100 ê, and Qr is 1.25×10−14 as described above, $V_e$ is 6.35 mV.

When the average frequency division value is 5,000+⅛, the ripple current makes change in the following order $$+3.5\ Q_r \rightarrow +2.5\ Q_r \rightarrow +1.5\ Q_r \rightarrow +0.5\ Q_r \rightarrow -0.5\ Q_r \rightarrow -1.5\ Q_r \rightarrow -2.5\ Q_r \rightarrow -3.5\ Q_r$$

Figure 4:
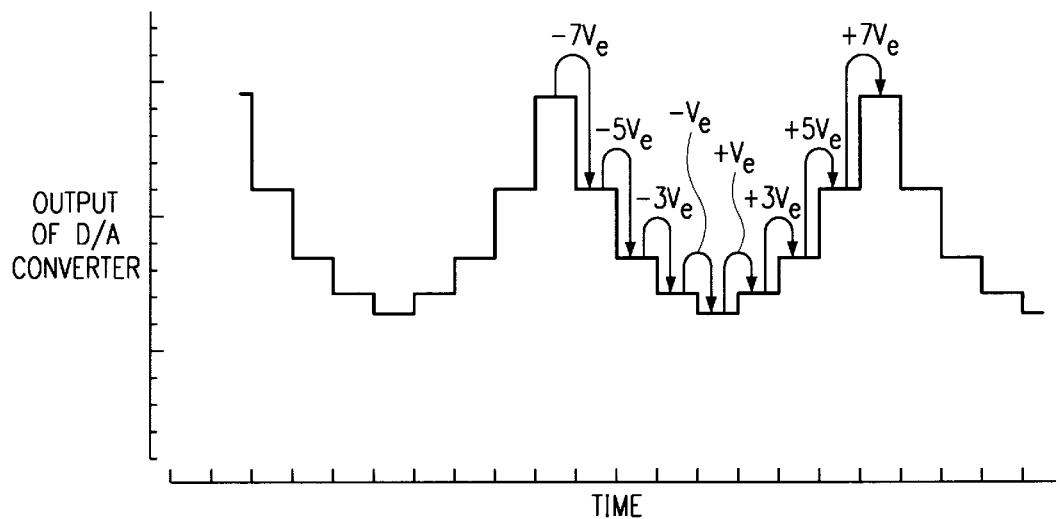
FIG. 4 is a graph illustrating the operation of the compensation circuit of the frequency synthesizer.

Consequently, as shown In FIG. 4, at the moment that the ripple current is output, the output voltage of D/A comparator 24 is changed in the order of −7 $V_e$, −5 $V_e$, −3 $V_e$, −1 $V_e$, +1 $V_e$, +3 $V_e$, +5 $V_e$, +7 $V_e$.

Also, in said compensation circuit 20, it is also possible to connect the output of DIA comparator 24 directly to the output stage of charge pump circuit 35 through capacitor 361 without using resistors 22 and 23.

Figure 5:
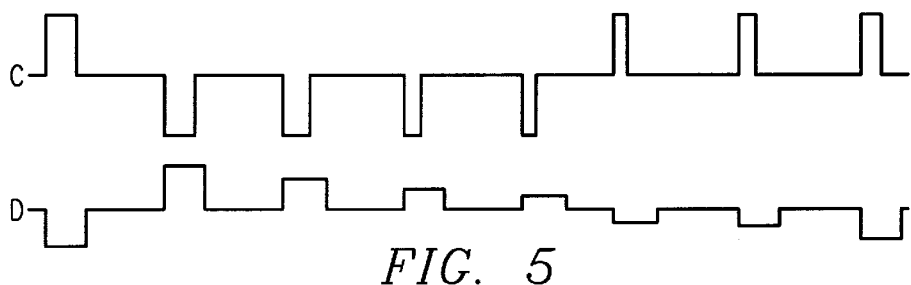
FIG. 5 is a timing diagram illustrating the ripple current and the compensation current in the frequency synthesizer of the invention.
Figure 6:
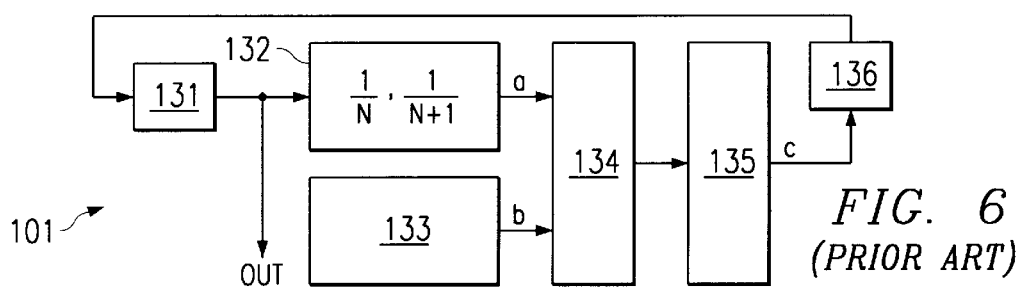
FIG. 6 is a block diagram illustrating the frequency synthesizer of the prior art.
Figure 7:
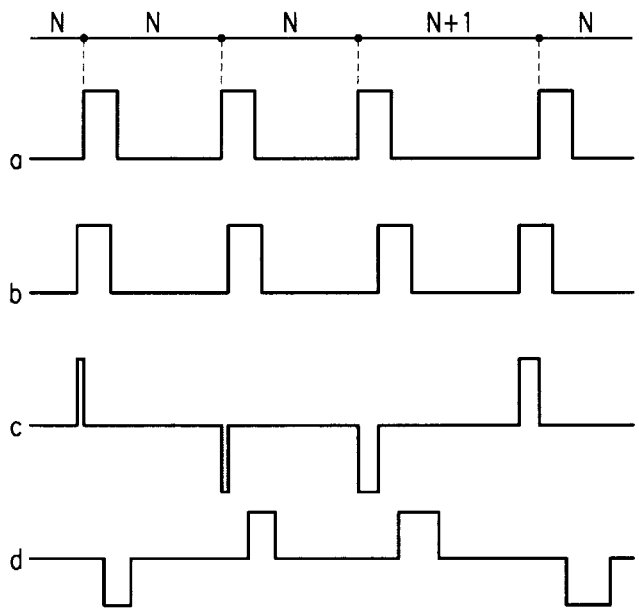
FIG. 7 is a timing diagram illustrating the operation of phase comparator of the frequency synthesizer.
Figure 8:
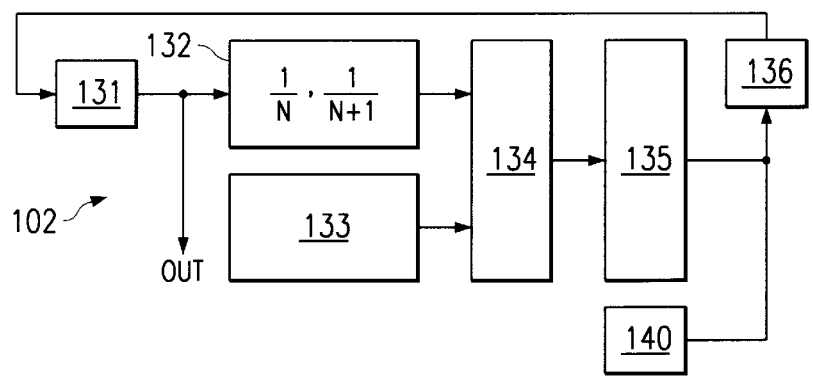
FIG. 8 is a block diagram illustrating a frequency sythesizer of the prior art having a compensation circuit.
Figure 9:
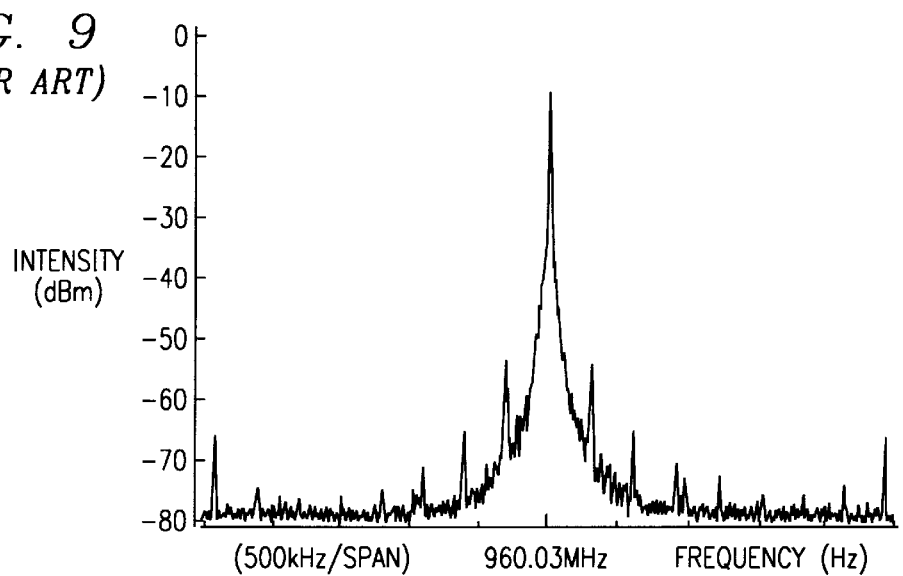
FIG. 9 is a graph illustrating the relationship between the frequency component and the output intensity of the frequency sythesizer.

As explained in the above, when compensation circuits 10 and 20 of the invention are used, with respect to the ripple current represented by C in FIG. 5, the peak current values become different However, compensation current D with the same charge amount and the opposite polarity can be generated and overlapped on the control signal output from charge pump circuit 35.

It is possible to compensate for the ripple current and to obtain an output free of spurious components.

TABLE I

| Average frequency division value | Charge amount of ripple current and number of capacitors with switching in connection | | | | | | | |
|---|---|---|---|---|---|---|---|---|
| 5000 + 1/8 Charge amount | +3.5 Qr | +2.5 Qr | +1.5 Qr | +0.5 Qr | −1.5 Qr | −1.5 Qr | −2.5 Qr | −3.5 Qr |
| Number of capacitors | −7 | −5 | −3 | −1 | +1 | +3 | +5 | +7 |
| 5000 + 2/8 Charge amount | −3 Qr | −1 Qr | +1 Qr | +3 Qr | | . . . | | |
| Number of capacitors | +6 | +2 | −2 | −6 | | . . . | | |
| 5000 + 3/8 Charge amount | −3.5 Qr | −0.5 Qr | +2.5 Qr | −2.5 Qr | +0.5 Qr | +3.5 Qr | −1.5 Qr | +1.5 Qr |
| Number of capacitors | +7 | +1 | −5 | +5 | −1 | −7 | +3 | −3 |
| 5000 + 4/8 Charge amount | −2 Qr | +2 Qr | | | . . . | | | |
| Number of capacitors | +4 | −4 | | | . . . | | | |
| 5000 + 5/8 Charge amount | −3.5 Qr | +1.5 Qr | −1.5 Qr | +3.5 Qr | +0.5 Qr | −2.5 Qr | +2.5 Qr | −0.5 Qr |
| Number of capacitors | +7 | −3 | +3 | −7 | −1 | +5 | −5 | +1 |
| 5000 + 6/8 Charge amount | −3 Qr | +3 Qr | +1 Qr | −1 Qr | | . . . | | |
| Number of capacitors | +6 | −6 | −2 | +2 | | . . . | | |
| 5000 + 7/8 Charge amount | −3.5 Qr | +3.5 Qr | +2.5 Qr | +1.5 Qr | +0.5 Qr | −0.5 Qr | −1.5 Qr | −2.5 Qr |
| Number of capacitors | +7 | −7 | −5 | −3 | −1 | +1 | +3 | +5 |

". . ." represents repetition.

What is claimed is:

1. A frequency synthesizer comprising:

an oscillator which outputs an output signal, a frequency divider which divides the output signal from the oscillator so that its frequency division value is in periodic variation to generate a comparative signal, a phase comparator which compares the phase of the comparative signal with the phase of a reference clock signal, and controls the aforementioned oscillator such that the oscillator output signal becomes a frequency that equals the frequency of the reference clock signal times the average frequency division value, and a phase compensation circuit connected to the transmission path of the signal that controls the oscillator from the phase comparator wherein the phase compensation circuit comprises:

a plurality of capacitors with one end connected to the transmission path of the signal that controls the oscillator from the phase comparator, at least two voltage sources connected to the other end of the capacitors through a plurality of switches, and a voltage controller to control the switches.

2. The frequency sythesizer described in claim 1 wherein the voltage controller has two or more power sources and plurality of switching circuits that output different voltages; the capacitors are connected to two or more of the aforementioned power sources through the aforementioned switching circuts, respectively; and, by operating the aforementioned switching circuits, it is possible to switch the power source connected to the desired capicitor.

3. The frequency synthesizer described in claim 1 wherein the aforementioned voltage controller is made up of a digital/analog converter so configured that the desired voltage can be applied to a capacitor of the phase compensation circuit.

4. A frequency synthesizer comprising:

an oscillator which outputs an output signal, a frequency divider which divides the output signal from the oscillator so that its frequency division value is in periodic variation to generate a comparative signal, a phase comparator which compares the phase of the comparative signal with the phase of a reference clock signal and outputs a phase comparator control signal, a charge pump circuit that converts the phase comparator control signal to a current signal, a low-pass filter which receives the current signal from the charge pump with an output that controls the aforementioned oscillator such that the oscillator output signal becomes a frequency that equals the frequency of the reference clock signal times the average frequency division value, and a phase compensation circuit comprising:

a plurality of capacitors with one end connected to the current signal from the charge pump and another end of each capacitor connected to at least two voltage sources through a plurality of switches, and a voltage controller to control the switches.

5. The frequency synthesizer described in claim 6 wherein the voltage controller has two or more power sources and plurality of switching circuits that output different voltages; the capacitors are connected to two or more of the aforementioned power sources through the aforementioned switching circuits, respectively; and, by operating the aforementioned switching circuits, it is possible to switch the power source connected to the desired capacitor.

6. The frequency synthesizer described in claim 5 wherein the aforementioned voltage controller is made up of a digital/analog converter so configured that the desired voltage can be applied to a capacitor of the phase compensation circuit.

* * * * *